(12) United States Patent
Stafford

(10) Patent No.: US 12,531,211 B2
(45) Date of Patent: Jan. 20, 2026

(54) SULFUR-CONTAINING MOLECULES FOR HIGH ASPECT RATIO PLASMA ETCHING PROCESSES

(71) Applicant: L'Air Liquide, Societe Anonyme pour l'Etude et l'Exploitation des Procedes Georges Claude, Paris (FR)

(72) Inventor: Nathan Stafford, Newark, DE (US)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 208 days.

(21) Appl. No.: 18/513,489

(22) Filed: Nov. 17, 2023

(65) Prior Publication Data

US 2025/0166974 A1    May 22, 2025

(51) Int. Cl.
*H01L 21/311* (2006.01)
*C09K 13/00* (2006.01)
*H01J 37/32* (2006.01)

(52) U.S. Cl.
CPC ........ *H01J 37/32449* (2013.01); *C09K 13/00* (2013.01); *H01L 21/31116* (2013.01); *H01J 2237/2001* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 9,460,935 B2 | 10/2016 | Chung | |
| 9,773,679 B2 | 9/2017 | Gupta et al. | |
| 11,315,797 B2 | 4/2022 | Kato et al. | |
| 2006/0226120 A1 | 10/2006 | Rusu et al. | |
| 2015/0249137 A1 | 9/2015 | Katsuhara et al. | |
| 2017/0309468 A1 | 10/2017 | Shirai et al. | |
| 2017/0372916 A1 | 12/2017 | Kudo et al. | |
| 2018/0286707 A1 | 10/2018 | Hudson et al. | |
| 2019/0206723 A1* | 7/2019 | Tokashiki | H01L 21/30655 |
| 2019/0292660 A1 | 9/2019 | Aoki et al. | |
| 2022/0375759 A1* | 11/2022 | Kim | H01L 21/0332 |
| 2023/0127467 A1 | 4/2023 | Takahashi et al. | |

FOREIGN PATENT DOCUMENTS

| | | |
|---|---|---|
| KR | 2001 0010568 | 2/2001 |
| KR | 2010 0070231 | 6/2010 |
| WO | WO 2022 119860 | 6/2022 |
| WO | WO 2022 119865 | 6/2022 |

OTHER PUBLICATIONS

International Search Report and Written Opinion for corresponding PCT/US2024/055218, Jan. 28, 2025.
Arora, P. et al., Role of sulfur in catalyzing fluorine atom fast etching of silicon with smooth surface morphology, J. Vac. Sci. Technol. A 37(6), Nov./Dec. 2019, 061303.
Dussart, R. et al., Plasma cryogenic etching of silicon: from the early days to today's advanced technologies, Journal of Physics: D: Applied Physics, 47:12 (2014), 123001, 27 pgs.
Kihara, Y. et al., Beyond 10 μm depth ultra-high speed etch process with 84% lower carbon footprint for memory channel hole of 3D NAND flash over 400 layers, 2023 Symposium on VLSI Technology and Circuits Digest of Technical Papers, Jun. 11-16, 2023, Kyoto, Japan, 2 pgs.
Kim, J.K. et al., Study on the etching characteristics of amorphous carbon layer in oxygen plasma with carbonyl sulfide, J. Vac. Sci. Technol. A 31(2), Mar./Apr. 2013, 021301.
Tinck, S. et al., Cryogenic etching of silicon with $SF_6/O_2/SiF_4$ plasmas: a modelling and experimental study, 22$^{nd}$ International Symposium on Plasma Chemistry, Jul. 5-10, 2015, Antwerp, Belgium, 3pgs.

* cited by examiner

*Primary Examiner* — Roberts P Culbert
(74) *Attorney, Agent, or Firm* — Yang Jiang

(57) ABSTRACT

A method for forming a structure using a patterned mask layer comprises introducing an etching gas containing a sulfur-containing gas into a reaction chamber, converting the etching gas to a plasma, and allowing an etching reaction to proceed between the plasma and the one or more silicon-containing films so that the one or more silicon-containing films are selectively etched versus the patterned mask layer to form the structure, wherein the sulfur-containing gas contains a —SH thiol group and an aromatic 6 membered carbon ring having the formula

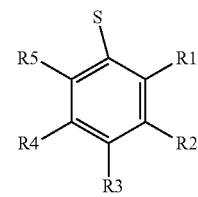

wherein R1, R2, R3, R4 and R5 are independently selected from F, H, and/or $C_xF_yH_z$ group substituted on the aromatic ring, where x, y and z are integers, and at least one of the R1, R2, R3, R4 and R5 contains at least one fluorine atom, and S represents the —SH thiol group.

20 Claims, No Drawings

SULFUR-CONTAINING MOLECULES FOR HIGH ASPECT RATIO PLASMA ETCHING PROCESSES

TECHNICAL FIELD

The present invention relates to a plasma etching method for forming a structure using a sulfur-containing aromatic etching compound to selectively remove one or more materials from a substrate to manufacture a semiconductor device such as DRAM, 3DNAND or other technologies. The sulfur-containing aromatic etching compound contains an aromatic 6 membered carbon ring having a sulfur element attached to the aromatic ring, wherein R1, R2, R3, R4, R5 are independently selected from F, H, and/or $C_xF_yH_z$ group substituted on the aromatic ring and at least one of the R1, R2, R3, R4, R5 contains at least one fluorine atom. The sulfur containing group, S, may represent a —SH thiol group.

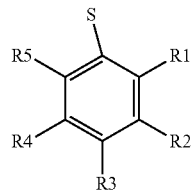

BACKGROUND

High aspect ratio (HAR) etching processes became a key process for memory device manufacturing. Ion energy control by increasing effective bias power for HAR features continues to advance. Great efforts have been made to increase ion energies to overcome charge build-up on the etching front inside HAR holes. Based on the trend of bias power in the past few years, the required power has exceeded 20 kW. Many challenges arise when the bias power is increased. The prevention of arcing and effective cooling, and power delivery systems are all critical for enabling high-power capability. Moreover, it is harder to compensate for neutral fluxes with increasing aspect ratio, because neutral species are transferred only by diffusion through the holes.

Plasma etching, especially in HAR structures, is a complex process that has not entirely understood. The chemistry of the plasma is composed of ions and neutrals. The neutrals as fragments from the etching chemistries injected into the plasma play a complex part in the formation of reactive species and polymer species. The reactive species may react with the substrate materials as well as other species in the plasma. Neutral species flux through the holes of the etched structure is complex as their reactivity and propensity to form polymer along with their sticking coefficients can impact their transport to different depths. C:F ratio for the etching chemistry is a basic idea that imparts some idea about potentially the species that result in the plasma but it is not predictive.

Vertical isotropy of etched features is obtained by ion transport during plasma sheath formation. In principle, positive and negative particles should have the same trajectories inside a hole and equalize the charge at the HAR hole bottom. But due to the electron shading effect, charge build-up at the bottom of HAR mask patterns, which can lead to incomplete etching, bowing, twisting, and CD variation between the top and bottom of the HAR stack. Therefore, lots of efforts were made by industry and are continuing to get rid of or minimize the sidewall charge-up during HAR etching, to improve the etch profile and CD control.

There are a number of commonly used sulfur molecules in the HAR etching process of a variety of films such as a-C mask materials and silicon containing materials. Gases such as COS, $SO_2$, $H_2S$ are commonly available sulfur-containing gas additives. The sulfur may provide a passivation layer on the amorphous carbon to help protect the surface from oxygen radicals and therefore help to prevent the bow-like structures. For example, Kim et al. (J. Vac. Sci. Technol. A 31 (2), March/April 2013) disclose that a 50 nm amorphous carbon hole etched in a gas mixture of $O_2$ and 5% COS produce a more anisotropic etch profile and improved the top/bottom opening ratio by about 37% as compared to those etched without COS.

A few prior arts are listed below that disclose sulfur-containing molecules that also contain C and F as well as application related prior arts.

U.S. Pat. No. 9,773,679B2 discloses sulfur-containing compounds for plasma etching channel holes, gate trenches, staircase contacts, capacitor holes, contact holes, etc., in Si-containing layers on a substrate and plasma etching methods of using the same. The plasma etching compounds may provide improved selectivity between the Si-containing layers and mask material, less damage to channel region, a straight vertical profile, and reduced bowing in pattern high aspect ratio structures. The sulfur-containing molecule has a formula selected from the group consisting of R1-SH, R2-S—R3, $C_2F_4S_2$ (CAS 1717-50-6), wherein R1, R2, and R3 are each independently a saturated $C_1$ to $C_4$ alkyl or fluoroalkyl group and R2 and R3 may be joined to form a 5 or 6 member S-containing ring. An inert gas is introduced into the chamber. U.S. Pat. No. 9,773,679B2 does not disclose that —SH may be on an aromatic ring, nor that an aromatic ring may contain C, H, F.

U.S. Pat. No. 9,460,935B2 relates to a method for fabricating a semiconductor device. The method comprises forming a first etching layer and a second etching layer stacked on a substrate, and forming a recess region by etching the first and second etching layers under plasma generated from an etching gas including a compound. The compound comprises at least one of 1,1,1,2,3,3-hexafluoropropane, 2,2,2-trifluoroethane-1-sulfur-, 1,1,1,3,3-pentafluoropropane, 1,1,2,2,3-pentafluoropropane and 1,1,2,2-tetrafluoro-1-iodoethane, 2,3,3,3-tetrafluoropropene and 1,1-difluoroethene. In Formula 1, $R_1$ may be F or $CF_3$. $R_2$ may be $CHF_2$, $CH_2F$, I, SH or SOH. $R_3$ and $R_4$ may be independently selected from H, F or $CHF_2$. In Formula 2, $R_5$ may be F or $CF_3$. $R_6$ may be F, $CHF_2$ or $CH_2F$. No aromatic disclosed as R group with the SH.

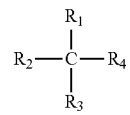

[Formula 1]

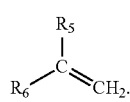

[Formula 2]

US20060226120A1 discloses a method for etching a dielectric layer over a substrate and disposed below a mask.

The substrate is placed in a plasma processing chamber. An etchant gas comprising $O_2$ and a sulfur component gas comprising at least one of $H_2S$ and a compound containing at least one carbon sulfur bond is provided into the plasma chamber. A plasma is formed from the etchant gas. Features are etched into the etch layer through the photoresist mask with the plasma from the etchant gas. They state it is believed that sulfur bonded to carbon, either that is formed during the process e.g., $H_2S$ and fluorocarbon, or is added directly to plasma e.g., COS, becomes incorporated into the sidewall polymer and makes the sidewall polymer more resistant to etching.

KR 2001010568 A discloses a method of dry etching of an oxide film, which increases etching selection ratio to a nitride film by side product non-volatile and unstable and prevents global warming because decomposition is easy in the atmosphere by using fluorocarbon gas containing sulfur as an etching gas. The method of dry etching of the oxide film using the nitride film as an etching barrier layer is characterized by providing the etching gas composed of fluorocarbon gas containing sulfur that is $C_4F_6S$, $C_3F_6S$, $C_3F_6S_2$, hydrofluorocabon (HFC) containing sulfur or mixture thereof, and the etching gas can contain further oxygen, gas contained oxygen, a $C_xF_y$ (x is integer of 1-6 and y is integer of 2-12) gas, a $C_xH_yF_z$ (x is integer of 1-6, y is integer of 1-4 and z is integer of 2-10) gas, an inert gas or mixture thereof.

WO2022119860 discloses a selective thermal atomic layer deposition (ALD) process, in which the process may comprise loading a substrate comprising a dielectric material, and a metal, into a reactor. The substrate may be reacted with a non-plasma based oxidant, thereby forming an oxidized metal surface on the metal. The substrate may be heated and exposed to a passivation agent that adsorbs more onto the oxidized metal than the dielectric material. Such exposure may form a passivation layer on the oxidized metal surface, and the substrate may be exposed to a silicon precursor that adsorbs more onto the dielectric material than the passivation layer, forming a chemi-adsorbed silicon-containing layer on the dielectric material. The substrate may be exposed to the non-plasma based oxidant, which simultaneously partially oxidizes the passivation layer, and oxidizes the chemi-adsorbed silicon-containing layer to form a silicon-containing dielectric film on the dielectric material. The sulfur molecules are used as passivating the surfaces (SAM's) for thermal etch process.

WO2022119865 discloses a selective plasma enhanced atomic layer deposition (ALD) process, in which the process may comprise loading a substrate comprising a dielectric material, and a metal, into a reactor. The substrate may be reacted with a non-plasma based oxidant, thereby forming an oxidized metal surface on the metal. The substrate may be heated and exposed to a passivation agent that adsorbs more onto the oxidized metal than the dielectric material. Such exposure may form a passivation layer on the oxidized metal surface, and the substrate may be exposed to a silicon precursor that adsorbs more onto the dielectric material than the passivation layer, forming a chem-adsorbed silicon-containing layer on the dielectric material. The substrate may be exposed to a plasma based oxidant, that simultaneously partially oxidizes the passivation layer, and oxidizes the chem-adsorbed silicon-containing layer to form a dielectric film on the dielectric material.

U.S. Ser. No. 11/315,797 discloses a plasma etching method that enables, in a semiconductor fabrication process, selective processing of a film consisting of a single material, such as $SiO_2$ or SiN, or a composite material of $SiO_2$ and SiN over a mask material as well as processing into satisfactorily vertical processed shapes. It is possible, for example, to enhance selectivity over a mask material or other materials excluding an etching target, to reduce damage on sidewalls, and to suppress etching in the lateral direction by generating a plasma of a gas compound having a thioether skeleton represented by general formula (3) or a mixed gas thereof and etching a film consisting of a composite material or a single material, such as $SiO_2$ or SiN, thereby depositing a protective film that contains sulfur atoms and has a lower content of fluorine atoms than the cases of using common hydrofluorocarbon gases: Rf1-S—Rf2, where Rf1 is a monovalent organic group represented by $C_xH_yF_z$ and Rf2 is a monovalent organic group represented by $C_aH_bF_c$. In more detail the formula is described as:

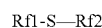

where Rf1 is a monovalent organic group represented by $C_xH_yF_z$; x, y, and z are each a positive number satisfying x=1 to 3, y=1 to 7, z=0 to 6, and y+z≤2x+1; Rf2 is a monovalent organic group represented by $C_aH_bF_c$; and a, b, and c are each a positive number satisfying a=1 to 3, b=0 to 6, c=1 to 7, and b+c≤2a+1. U.S. Ser. No. 11/315,797 does not disclose aromatic molecules.

KR2010070231 discloses organic thin film transistor, patterning method, and method of fabricating organic thin film transistor and liquid crystal display device using thereof. An organic thin film transistor, a patterning method, and a method for fabricating organic thin film transistor and a liquid crystal display device using thereof are provide to patterning metal layer by Self Assembly Monolayer (SAM) material, thereby simplifying manufacturing process. A metal layer (112a) is formed on a substrate. A SAM layer (120a) is formed by spreading SAM which is comprised of $X(CH_2)_nSH$ (X is one among $CH_3$, F, $C_6H_{5-y}F_y$ (y is 1-5), $NH_2$, n is 3-30) or $C_6H_{5-y}F_ySH$ (y is 1-5) material. An ultraviolet ray is emitted in the partial area of SAM. A SAM pattern is formed on material layer because of removal of a SAM layer which is ultraviolet ray is emitted by washing the SAM layer with washing solution. A pattern is formed as metal layer is etched by a SAM pattern. Here the thiol molecule is used as a SAM for a protection layer, not used as an etchant.

US20170372916 discloses an etching process method in a cryogenic temperature environment where the temperature of a substrate is controlled to be less than or equal to −35° C., supplying a sulfur fluoride-containing gas and a hydrogen-containing gas, generating a plasma from the supplied sulfur fluoride-containing gas and hydrogen-containing gas, and etching a laminated film made up of laminated layers of silicon-containing films having different compositions with the generated plasma. The etching is promoted mainly by the F component of $SF_6$, and a protective film is formed on the side wall of the etched hole mainly by the S component of $SF_6$ such that side etching can be suppressed. Examples of sulfur fluoride-containing ($S_xF_y$) gases that may be used include $S_2F_2$, $SF_3$, $SF_6$, $SF_4$, and $S_8F_{10}$.

US 2023/0127467 discloses a process for low temperature etching that uses a HF gas, $C_xF_y$ gas or $C_sH_tF_u$ gas, and oxygen containing gas to etch SiN, and a second plasma step using a HF gas, $C_vF_w$ gas, and oxygen containing gas to etch $SiO_2$. The substrate is set to 0° C. or lower, in which the HF generating gas or HF species includes at least one of gas, radicals and ions of hydrogen fluoride. The temperature is disclosed as less than 0° C., and as low as −70° C. or lower. In addition are disclosed the addition of phosphorous containing molecules such as $PF_3$, $PCl_3$, $PF_5$, $PCl_5$, $POCl_3$, $PH_3$, $PBr_3$, and $PBr_5$ to the etch. The phosphorus-containing gas may promote the adsorption of HF species in the plasma onto the surface of the substrate. In a related disclosure, Kihara et al (2023 Symposium on VLSI Technology and Circuits Digest of Technical Papers) discloses that the phosphorus containing gas plays an important role in accelerating the $SiO_2$ etching rate. The example given, $PF_3$, is disclosed to act as an effective catalyst in promoting the reaction rate between HF and $SiO_2$.

US20180286707 discloses methods and apparatus for etching a feature in a substrate. The feature may be etched in dielectric material, which may or may not be provided in a stack of materials. The substrate may be etched using cryogenic temperatures and particular classes of reactants. In various examples, the substrate may be etched at a temperature of about −20° C. or lower, using a mixture of reactants that includes at least one reactant that is an iodine-containing fluorocarbon, an iodine-containing fluoride, a bromine-containing fluorocarbon, a sulfur-containing reactant, or one of another select set of reactants. In various embodiments, the combination of low processing temperature with particular reactants results in very effective bow control. The sulfur gases may include sulfur-containing reactants (e.g. sulfur hexafluoride ($SF_6$), hydrogen sulfide ($H_2S$), sulfur dioxide ($SO_2$), carbon disulfide ($CS_2$) carbonyl sulfide (COS), and other sulfur-containing reactants).

Arora et al (J. Vac. Sci. Technol. A 37(6), November/December 2019) disclose that adsorbed sulfur acted as a catalyst to greatly enhance the etching rate of Si utilizing an $SF_6$/Ar plasma. The cryogenic plasma etching of silicon is a well known process often utilizing SF6 based plasmas (see for example Tinck et al (22nd International Symposium on Plasma Chemistry Jul. 5-10, 2015) titled "Cryogenic etching of silicon with $SF_6/O_2/SiF_4$ plasmas: a modelling and experimental study; and Journal of physics: D: applied physics—ISSN 0022-3727-48:15(2015), 155204, Dussart et al J. Phys. D: Appl. Phys. 47 (2014) 123001 (27 pp)). However, $SF_6$ has a very high Global Warming potential (GWP), with a $GWP_{100}$ of 24,300 (24,300 times higher than the global warming impact of $CO_2$) according to the Intergovernmental panel on Climate Change (IPCC) sixth assessment report (AR6).

Thus, a need remains for new etch gas compositions that contains sulfur for use in plasma etching applications, which may maintain selectivity and high aspect ratio for a wide range of process conditions and have a low expected GWP.

SUMMARY

Disclosed is an etching method for forming a structure by selectively etching one or more silicon-containing films in a substrate using a patterned mask layer deposited on top of the one or more silicon-containing films, the method comprising:
mounting the substrate in a reaction chamber;
introducing an etching gas containing a sulfur-containing gas into the reaction chamber;
converting the etching gas to a plasma; and
allowing an etching reaction to proceed between the plasma and the one or more silicon-containing films so that the one or more silicon-containing films are selectively etched versus the patterned mask layer to form the structure,
wherein the sulfur-containing gas contains a —SH thiol group and an aromatic 6 membered carbon ring having the formula

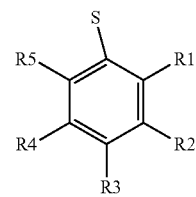

wherein R1, R2, R3, R4 and R5 are independently selected from F, H, and/or $C_xF_yH_z$ group substituted on the aromatic ring, where x, y and z are integers, and at least one of the R1, R2, R3, R4 and R5 contains at least one fluorine atom, and S represents the —SH thiol group. The disclosed etching method may include one or more of the following features:
the sulfur-containing group, S, representing a —SH thiol group;
the —SH thiol group attaching to the aromatic 6 membered carbon ring;
the $C_xF_yH_z$ group being selected from $CF_3$, $CH_2F$, or $CHF_2$;
further comprising
adding one or more hydrofluorocarbon, fluorocarbon, sulfur fluoride or nitrogen fluoride etching gases to the sulfur-containing gas, wherein the one or more hydrofluorocarbon or fluorocarbon, sulfur fluoride or nitrogen fluoride etching gases are selected from $C_4F_6$, $C_4F_8$, $C_4H_2F_6$, $CHF_3$, $CH_2F_2$, $CH_3F$, $CF_4$, $C_2F_6$, $C_3F_8$, $SF_6$, $NF_3$, $C_2F_4$, $C_3F_6$, $C_4F_{10}$, $C_5F_8$, $C_6F_6$, $C_2H_5F$, $C_3H_7F$, $C_3H_2F_6$, $C_2HF_5$, $C_2H_2F_2$, $C_xF_yH_z$ molecule (x, y, and z are integers) or combination thereof;
further comprising
adding an additive to the sulfur-containing gas, wherein the additive is selected from $H_2$, $SF_6$, $NF_3$, $N_2$, $NH_3$, $Cl_2$, $BCl_3$, $BF_3$, $PF_3$, $PCl_3$, $PBr_3$, $PH_3$, $POCl_3$, $PF_5$, $POF_3$, $PH_3$ or $P(R)_3$ where R is an alkyl, or fluorinated alkyl groups selected from $CF_3$, $Br_2$, $F_2$, HF, HBr, HCl, HI, $IF_5$, or $IF_7$;
further comprising
prior to activating the plasma, sequentially or simultaneously exposing the substrate to a co-reactant;
the co-reactant being selected from $O_2$, CO, $CO_2$, NO, $NO_2$, $N_2O$, $SO_2$, $H_2S$, or COS or combinations thereof;
the co-reactant being selected from $H_2$, $SF_6$, $NF_3$, $N_2$, $NH_3$, $Cl_2$, $BCl_3$, $BF_3$, $PF_3$, $PCl_3$, $PBr_3$, $PH_3$, $POCl_3$, $PF_5$, $POF_3$, $PH_3$ or $P(R)_3$ where R is an alkyl, or fluorinated alkyl groups selected from $CF_3$, $Br_2$, $F_2$, HF, HBr, HCl, HI, $IF_5$, or $IF_7$;
further comprising
prior to activating the plasma, sequentially or simultaneously exposing the substrate to an inert gas selected from Ar, Kr, Xe, Ne, $N_2$, He or combination thereof;
a temperature of the substrate ranging from approximately −196° C. to approximately 300° C.;
a temperature of the substrate ranging from approximately −196° C. to approximately 60° C.;
a temperature of the substrate ranging from approximately −196° C. to approximately 25° C.;
a temperature of the substrate ranging from approximately −196° C. to approximately −50° C.;

further comprising
cooling the substrate to a temperature below approximately 25° C.;
the temperature of the substrate being below approximately −20° C.;
the temperature of the substrate ranging from approximately −196° C. to approximately −20° C.;
the sulfur-containing gas being selected from the group consisting of $C_6HF_5S$, $C_6H_4F_2S$, $C_7HF_7S$, $C_7H_5F_3S$, $C_6H_4F_2S$, $C_6H_3F_3S$, $C_6H_3F_3S$, $C_6H_3F_3S$, $C_7H_4F_4S$, $C_7H_3F_5S$, $C_8H_3F_7S$, $C_7H_3F_5S$, $C_7H_3F_5S$, and $C_7H_4F_4S$;
a mask material of the patterned mask layer being amorphous carbon, doped amorphous carbon, Si, SiN, Al, AlO, Ti, TiO or a metal and metal oxide;
the one or more silicon-containing films including $Si_aO_bC_cN_dHe$ where a, b, c, d, e range from 0.1 to 6 and b, c, d, e each is independently 0;
the substrate being silicon-containing material;
the substrate being $SiO_2$, SiN, Si or an alternating layers of SiO and SiN;
the aspect ratio of the aperture or structure ranging from 1:1 to 5:1;
the aspect ratio of the aperture or structure being above 1:1;
the aspect ratio of the aperture or structure being above 5:1;
the aspect ratio of the aperture or structure being above 10:1;
the aspect ratio of the aperture or structure being above 20:1;
the aspect ratio of the aperture or structure ranging from approximately 5:1 to approximately 500:1;
the aspect ratio of the aperture or structure ranging from approximately 20:1 to approximately 400:1;
the aspect ratio of the aperture or structure having an aspect ratio greater than 50:1;
the aperture having a diameter ranging from approximately 0.1 nm to approximately 500 nm;
the aperture having a diameter ranging from approximately 5 nm to approximately 500 nm;
the aperture having a diameter less than 100 nm; and
after the aperture or structure is formed, the temperature of the substrate being increased to greater than −20° C.

Notation and Nomenclature

The following detailed description and claims utilize a number of abbreviations, symbols, and terms, which are generally well known in the art. Certain abbreviations, symbols, and terms are used throughout the following description and claims, and include:

As used herein, the indefinite article "a" or "an" means one or more.

As used herein, "about" or "around" or "approximately" in the text or in a claim means±10% of the value stated.

As used herein, "room temperature" in the text or in a claim means from approximately 20° C. to approximately 25° C.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiC, SiCN, SiOCN, SiCOH, etc.), metal containing layers (e.g., copper, cobalt, ruthenium, tungsten, manganese, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "wafer" or "patterned wafer" refers to a wafer having a stack of silicon-containing films on a substrate and a patterned hardmask layer on the stack of silicon-containing films formed for pattern etch.

The term "processing" as used herein includes patterning, exposure, development, etching, deposition, cleaning, and/or removal of by-products, as required in forming a described structure.

The term "pattern etch" or "patterned etch" refers to etching a non-planar structure, such as a patterned mask layer on a stack of silicon-containing films.

As used herein, the term "etch" or "etching" means to use a plasma to remove material via ion bombardment, remote plasma, or chemical vapor reaction between the etching gas and substrate and refers to an isotropic etching process and/or an anisotropic etching process. The isotropic etch process involves a chemical reaction between the etching compound and the substrate resulting in part of material on the substrate being removed. This type of etching process includes chemical dry etching, vapor phase chemical etching, thermal dry etching, or the like. The isotropic etch process produces a lateral or horizontal etch profile in a substrate. The isotropic etch process produces recesses or horizontal recesses on a sidewall of a pre-formed aperture in a substrate. The anisotropic etch process involves a plasma etching process (i.e., a dry etch process) in which ion bombardment accelerates the chemical reaction in the vertical direction so that vertical sidewalls are formed along the edges of the masked features at right angles to the substrate (Manos and Flamm, Thermal etching an Introduction, Academic Press, Inc. 1989 pp. 12-13). The plasma etching process produces a vertical etch profile in a substrate. The plasma etching process produces vertical vias, apertures, trenches, channel holes, gate trenches, staircase contacts, capacitor holes, contact holes, slit etch, self-aligned contact, self-aligned vias, super vias etc., in the substrate.

Please note that the films or layers to be etched, such as silicon oxide or silicon nitride, may be listed throughout the specification and claims without reference to their proper stoichiometry (i.e., $SiO_2$, $SiO_3$, $Si_3N_4$). The layers may include pure (Si) layers, such as crystalline Si, poly-silicon (p-Si or polycrystalline Si), or amorphous silicon; silicon carbide ($Si_oC_p$) layers, silicon nitride ($Si_kN_l$) layers; silicon oxide ($Si_nO_m$) layers; or mixtures thereof, wherein k, l, m, n, o, and p inclusively range from 1 to 6. For instance, silicon oxide is $Si_nO_m$, wherein n ranges from 0.5 to 1.5 and m ranges from 1.5 to 3.5. Preferably, the silicon oxide layer is SiO$_2$ or SiO$_3$. Herein, SiN and SiO in the following description are used to represent Si$_k$N$_l$ and Si$_n$O$_m$ containing layers, respectively. The silicon-containing film could also be a silicon oxide based dielectric material such as organic based or silicon oxide based low-k dielectric materials such as the Black Diamond II or III material by Applied Materials, Inc. with a formula of SiOCH. Alternatively, any referenced silicon-containing layer may be pure silicon. Silicon-containing film may also include Si$_a$O$_b$C$_c$N$_d$He where a, b, c, d, e range from 0.1 to 6 and b, c, d, e each may be independently 0. The silicon-containing films may also include dopants, such as B, C, P, As Ga, In, Sn, Sb, Bi and/or Ge.

As used herein, the term "hydrocarbon" refers to a saturated or unsaturated function group containing exclusively carbon and hydrogen atoms. As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the term "hydrofluorocarbon" refers to a saturated or unsaturated function group containing exclusively carbon, fluoride and carbon atoms.

As used herein, the term "fluorocarbon" refers to a saturated or unsaturated function group containing exclusively fluoride and hydrogen atoms.

The term "mask" refers to a layer that resists etching. The mask layer may be located above the layer to be etched. The mask layer also refers to a hardmask layer. A mask layer can be a carbon-containing layer, a silicon-containing layer, a metal-containing or metal-oxide or metal-nitride containing layer.

The term "etch stop" refers to a layer below the layer to be etched that protects layers underneath.

The term "aspect ratio" refers to a ratio of the height of a trench (or via) to the width of the trench (or the diameter of the via).

The term "high aspect ratio (HAR)" refers to an aspect ratio ranging from approximately 1:1 to approximately 500:1, preferably from approximately 20:1 to approximately 400:1.

The term "high aspect ratio etching" refers to the formation of a hole pattern in a target film by plasma etching method when aspect ratio of formed hole structures is exceeding value of 5.

The term "selectivity" means the ratio of the etch rate of one material to the etch rate of another material. The term "selective etch" or "selectively etch" means to etch one material more than another material, or in other words to have a greater or less than 1:1 etch selectivity between two materials.

Note that herein, the terms "aperture", "via", "hole", "trench" and "structure" may be used interchangeably to refer to an opening formed in a semiconductor structure.

As used herein, the abbreviation "NAND" refers to a "Negative AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "etch gas", "etching compound" and "etchant" may be used interchangeably when the etch gas is in a gaseous state at room temperature and ambient pressure. It is understood that an etch gas may correspond to, or be related to an etchant or etching compound, and that the etchant may refer to the etch gas.

The terms "dope" or "doping" is used interchangeably to the process of incorporation of one or more elements into a film through various methods where that element may be chemically bond or physically bond, and the process of intentionally incorporating atoms of different elements into the film composition. The element(s) may be doped interstitial or substitutional within the film.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

The term "independently" when used in the context of describing R groups should be understood to denote that the subject R group is not only independently selected relative to other R groups bearing the same or different subscripts or superscripts, but is also independently selected relative to any additional species of that same R group. For example in the formula MR$^1_x$ (NR$^2$R$^3$)$_{(4-x)}$, where M is an atom, x is 2 or 3, the two or three R$^1$ groups may, but need not be identical to each other or to R$^2$ or to R$^3$. Further, it should be understood that unless specifically stated otherwise, values of R groups are independent of each other when used in different formulas.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

The terms "via", "aperture", "trench", and "hole" are sometimes used interchangeably, and generally mean an opening in an interlayer insulator.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Optional or optionally means that the subsequently described event or circumstances may or may not occur. The description includes instances where the event or circumstance occurs and instances where it does not occur.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

"Comprising" in a claim is an open transitional term that means the subsequently identified claim elements are a nonexclusive listing (i.e., anything else may be additionally included and remain within the scope of "comprising"). "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actors in the absence of express language in the claim to the contrary.

DESCRIPTION OF PREFERRED EMBODIMENTS

Disclosed are the use of fluorinated aromatic sulfur-containing molecules in plasma etching applications such as high aspect ratio etching for DRAM and 3DNAND flash manufacturing processes as well as atomic layer etching processes of silicon materials. The fluorinated aromatic sulfur-containing molecules are conceived to have both a sulfur-containing group, such as a thiol (SH) group, along with an aromatic carbon ring and at least one fluorine. The sulfur-containing group or the thiol group is known to bind to silicon surfaces and help passivate the surface from etching, a sidewall passivation layer which is a sulfur containing polymer of $C_xH_yF_z$—S (where x, y and z each are fractional compositions) formed by depositing on sidewalls. In addition as sulfur helps in protecting carbon mask materials it is expected to increase etch selectivity to a mask layer. The addition of the aromatic structure is expected to increase the conductivity of the polymer that may help in charge reduction in the sidewall due to the insulating nature of the $C_xH_yF_z$—S polymers. Finally, the C, F, H elements of the molecule are expected to help in the etching of the silicon containing layers though formation of $SiF_x$ byproducts along with forming $C_xH_yF_z$—S passivation layer containing polymer layers. The H atoms of the molecule are known to aid in the etching of SiN layers.

Concerning the deposited sulfur containing polymer, it is proposed that these molecules may make polymer similar to polyphenylene sulfide (PPS) polymer

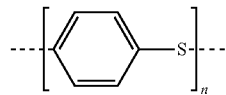

but with various amounts of fluorine that might be conductive with various oxidation and dopants. PPS is a very important high temperature resistant type polymer that is resistant to acids thus might be advantageous as a sidewall polymer coating for the high aspect ratio etching process to resist chemical etching that causes lateral etching and bowing.

It is expected that the deposited polymer of the aromatic-sulfur etching gases will have a higher conductivity than non-aromatic fluorocarbon materials such as $cC_4F_8$. To our knowledge, between a non-aromatic ($cC_4F_8$) and an aromatic molecule ($C_6F_6$), the conductivity changes by a factor of 10 times increase. Polymer of $cC_4F_8$ and $C_6F_6$ were deposited on bare Si wafer substrate, using the 300 mm dual-frequency CCP etcher. After the deposition, Materials Development Corporation (MDC) Mercury probe equipped with Keithley 2635 source meter is utilized for I-V measurement. Diameter of the mercury dot is 760 um, which gives a contact area of $4.5 \times 10^{-3}$ $cm^2$. The higher the current showing on the I-V plot, the higher conductivity of the surface being analyzed. Table 1 below gives the estimated currents for different molecules at an electric field of 0.3 V.

TABLE 1

| Chemistry | Current (A) @ 0.3 V | Aromatic? (Y/N) |
|---|---|---|
| $cC_4F_8$ | 4E−11 | N |
| $C_6F_6$ | 3E−10 | Y |

The deposited polymer may be useful for atomic layer etching processes whereby a cyclic etching process is used where a polymer is deposited utilizing the fluorinated aromatic sulfur molecules followed by an etching step utilizing an etchant such as a fluorocarbon $C_xF_yH_z$ molecule (where x, y, z are integers, C>1 and H≥0), or an inert gas such as Argon to sputter the surface, or may include an oxidant such as $O_2$. The cyclic etching process may include various methods of purging with inert gases, pulsing of plasma and reactants, and other known methods in the art. The process may be cycled from deposition and etching process for one or more cycles.

The disclosed plasma etchant gas/liquids shown below in a molecular structure formula comprise an aromatic 6 membered carbon ring having a sulfur element attached to the aromatic ring, wherein R1, R2, R3, R4, R5 are independently selected from F, H, and/or $C_xF_yH_z$ group substituted on the aromatic ring, such as $CF_3$, $CHF_2$, $CH_2F$, etc., and at least one of the R1, R2, R3, R4, R5 contains at least one fluorine atom. The sulfur-containing group, S, may represent a —SH thiol group.

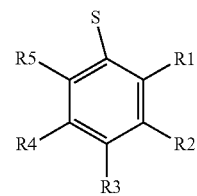

To our knowledge, the above disclosed formula and/or exemplary disclosed sulfur-containing molecules listed below in Table 2 have not been used in relation to plasma etching.

TABLE 2

| Molecular formula | CAS No. | Structure | Boiling point | C/F ratio | # of H | Most favorable etch application |
|---|---|---|---|---|---|---|
| $C_6HF_5S$ | 771-62-0 | pentafluorothiophenol | 143° C. | 1.2 | 1 | $SiO_2$, SiN |
| $C_6H_4F_2S$ | 60811-24-7 | 3,4-difluorothiophenol | 70° C. @ 13torr | 3 | 4 | SiN |
| $C_7HF_7S$ | 651-84-3 | 2,3,5,6-tetrafluoro-4-(trifluoromethyl)thiophenol | 169° C. | 1 | 1 | $SiO_2$, SiN |
| $C_7H_5F_3S$ | 937-00-8 | 3-(trifluoromethyl)thiophenol | 163° C. | 2.3 | 5 | SiN |
| $C_6H_3F_3S$ | 443683-32-7 | 2,3,4-trifluorothiophenol | 160.2 ± 35.0° C. predicted | 2 | 3 | $SiO_2$, SiN |
| $C_6H_3F_3S$ | 13634-91-8 | 2,4,5-trifluorothiophenol | 73-75° C. @ 50torr | 2 | 3 | $SiO_2$, SiN |
| $C_6H_3F_3S$ | 13634-92-9 | 2,4,6-trifluorothiophenol | 67-68° C. @ 30torr | 2 | 3 | $SiO_2$, SiN |
| $C_7H_4F_4S$ | 1208075-20-0 | 4-fluoro-3-(trifluoromethyl)thiophenol | 181.9 ± 40.0° C. predicted | 1.75 | 4 | $SiO_2$, SiN |

TABLE 2-continued

| Molecular formula | CAS No. | Structure | Boiling point | C/F ratio | # of H | Most favorable etch application |
|---|---|---|---|---|---|---|
| $C_7H_3F_5S$ | 1349717-99-2 | | 182.3 ± 40.0° C. predicted | 1.4 | 3 | $SiO_2$, SiN |
| $C_8H_3F_7S$ | 1805596-80-8 | | 160.9 ± 40.0° C. predicted | 1.1 | 3 | $SiO_2$, SiN |
| $C_7H_3F_5S$ | 2384806-52-2 | | 175.0 ± 40.0° C. predicted | 1.4 | 3 | $SiO_2$, SiN |
| $C_7H_3F_5S$ | 2386446-67-7 | | 165.6 ± 40.0° C. predicted | 1.4 | 3 | $SiO_2$, SiN |
| $C_7H_4F_4S$ | 1807084-01-0 | | 188.9 ± 40.0° C. predicted | 1.75 | 4 | $SiO_2$, SiN |
| $C_6H_5FS$ | 371-42-6 | | 162° C. | 1.2 | 5 | SiN etch |
| $C_6H_5FS$ | 2557-78-0 | | 164° C. | 1.2 | 5 | SiN |
| $C_6H_5FS$ | 2557-77-9 | | 156° C. | 1.2 | 5 | SiN |
| $C_6H_4F_2S$ | 1996-44-7 | | 59° C./20 mmHg | 3 | 4 | SiN |

TABLE 2-continued

| Molecular formula | CAS No. | Structure | Boiling point | C/F ratio | # of H | Most favorable etch application |
|---|---|---|---|---|---|---|
| $C_7H_5F_3S$ | 13333-97-6 | (benzene ring with CF$_3$ and SH substituents) | 64° C./10 mmHg | 2.3 | 5 | SiN |
| $C_8H_4F_6S$ | 130783-02-7 | (benzene ring with two CF$_3$ groups and SH) | 167° C. | 1.3 | 4 | SiO$_2$, SiN |
| $C_6H_2F_4S$ | 769-40-4 | (benzene ring with HS and three F) | 147° C. | 1.5 | 2 | SiO$_2$, SiN |

The disclosed etching sulfur-containing molecules are expected to have a very low GWP (Global warming potential) based on the aromatic containing structure. As a comparison, the aromatic molecule $C_6F_6$ has a $GWP_{100}$ of 7 (see Sung et at, Materials 2022, 15, 1300.) as compared to the strait chained fully fluorinated $C_6F_{14}$ with a $GWP_{100}$ of 8620 and cyclic-$C_4F_8$ with a $GWP_{100}$ of 10,200.

Based on the F/C ratio and number of hydrogens the potential applications for the disclosed sulfur-containing etchants are identified in Table 2 to include SiO and SiN etching applications. For example, if the hydrogen to fluorine ratio is high then the molecule may be a good SiN etching gas. A molecule that has both F and H and where F≥H could be useful for both SiN and SiO etching, for example for 3DNAND applications.

Based on the F/C ratio as well as number of H Table 3 lists the preferred molecules for SiO and SiN etching application.

TABLE 3

| Molecular formula | CAS No. | Structure | Boiling point | C/F ratio | # of H | applications |
|---|---|---|---|---|---|---|
| $C_6HF_5S$ | 771-62-0 | (benzene with SH and five F) | 143° C. | 1.2 | 1 | SiO$_2$, SiN etch |
| $C_6H_2F_4S$ | 769-40-4 | (benzene with HS and three F) | 147° C. | 1.5 | 2 | SiO$_2$, SiN etch |
| $C_7HF_7S$ | 651-84-3 | (benzene with SH, four F, and CF$_3$) | 169° C. | 1 | 1 | SiO$_2$, SiN etch |

The disclosed etching method for forming a structure by selectively etching one or more silicon-containing films in a substrate using a patterned mask layer deposited on top of the one or more silicon-containing films comprises:

mounting the substrate in a reaction chamber, introducing an etching gas containing a sulfur-containing gas into the reaction chamber;

converting the etching gas to a plasma; and allowing an etching reaction to proceed between the plasma and the one or more silicon-containing films so that the one or more silicon-containing films are selectively etched versus the patterned mask layer to form the structure, wherein the sulfur-containing gas contains an aromatic 6 membered carbon ring having the formula

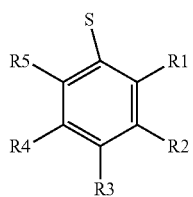

wherein R1, R2, R3, R4 and R5 are independently selected from F, H, and/or $C_xF_yH_z$ group substituted on the aromatic ring, where x, y and z are integers, and at least one of the R1, R2, R3, R4 and R5 contains at least one fluorine atom. The $C_xF_yH_z$ group may be $CF_3$, $CH_2F$ and $CHF_2$ groups or the like. The sulfur containing group, S, may represent a —SH thiol group.

The reaction chamber may be any enclosure or chamber within a device in which etching methods take place such as, and without limitation, reactive ion etching (RIE), CCP with single or multiple frequency RF sources, inductively coupled plasma (ICP), or microwave plasma reactors, or other types of etching systems capable of selectively removing a portion of the silicon-containing film or generating active species or depositing films. The plasma may be generated remotely or within the reactor itself.

The reaction chamber is equipped with parallel plate electrodes plasma generators where a high frequency electromagnetic field of 60 MHz is applied to the upper electrode and a 2 MHz one is applied to the lower electrode, when the gap between the electrodes is kept in a range between 10 and 35 mm. Combination of these electric fields allows applying power to the upper electrode within a range of 0-2000 W and to the lower electrode within the range of 1500-7000 W. The plasma may be generated with a RF power ranging from about 25 W to about 100 kW. The plasma may be generated remotely or within the reaction chamber itself. RF frequency of the plasma may range from 100 KHz to 1 GHz. The plasma may be pulsed or continuous wave. In some embodiments, the power applied to the chamber may range from 0 to several kW of bias power and hundreds to several thousand kW of source power.

Temperature within the reaction chamber is held at conditions suitable for the processing films to react with the activated etching gas. Substrate temperature in the reaction chamber may range from approximately −196° C. to approximately 150° C.; preferably from approximately −196° C. to approximately 100° C.; more preferably from −50° C. to approximately 25° C., even more from approximately 0° C. to approximately 25° C. The substrates may be cooled by a variety of sources including commercially available chillers or other methods such as liquid $N_2$. For example, these sulfur-containing etchants may be especially useful in cryogenic etching processes at substrate temperatures <−20° C. After the cryogenic etching processes, the substrate may be warmed up to >−50° C. such that byproducts of the reaction are evaporated away into a vacuum exiting the reaction chamber. Reaction chamber wall temperature may be around >20° C., preferably <50° C. The reaction chamber wall temperature may be around room temperature or larger but less than 50° C. depending on process requirements. Other portions of the chamber, such as the chamber lid, gas delivery lines, and downstream lines may be heated to temperatures from room temperature to >20° C. to 300° C.

Pressure within the reaction chamber is held at conditions suitable for the processing films to react with the activated etching gas. For instance, the pressure in the chamber may be held between approximately 1 mTorr and approximately 100 Torr, preferably between approximately 10 mTorr and approximately 1 Torr, more preferably between approximately 10 mTorr and approximately 100 mTorr, as required by etching parameters. Pressure in the etching chamber during the plasma-etching process may be maintained between 15 and 30 mTorr with introduced the process gas mixture.

Additionally, one or more hydrofluorocarbon or fluorocarbon etching gases may be added to the sulfur-containing gas. The additional one or more hydrofluorocarbon, fluorocarbon, sulfur fluoride or nitrogen fluoride etching gases may be selected from $C_4F_6$, $C_4F_8$, $C_4H_2F_6$, $CHF_3$, $CH_2F_2$, $CH_3F$, $CF_4$, $C_2F_6$, $C_3F_8$, $SF_6$, $NF_3$, $C_2F_4$, $C_3F_6$, $C_4F_{10}$, $C_5F_8$, $C_6F_6$, $C_2H_5F$, $C_3H_7F$, $C_3H_2F_6$, $C_2HF_5$, $C_2H_2F_2$, $C_xF_yH_z$ molecule (x, y, and z are integers) or combination thereof.

Other gases, such as additives, may be added to the sulfur-containing gas, which include $H_2$, $SF_6$, $NF_3$, $N_2$, $NH_3$, $Cl_2$, $BCl_3$, $BF_3$, $PF_3$, $PCl_3$, $PBr_3$, $PH_3$, $POCl_3$, $PF_5$, $POF_3$, $PH_3$ or $P(R)_3$ where R is an alkyl, or fluorinated alkyl groups selected from $CF_3$, $Br_2$, $F_2$, HF, HBr, HCl, HI, $IF_5$, or $IF_7$.

The disclosed plasma etching method further comprises, prior to activating a plasma, sequentially or simultaneously exposing the substrate to a co-reactant with or without an additive, wherein the co-reactant is selected from $O_2$, CO, $CO_2$, NO, $NO_2$, $N_2O$, $SO_2$, $H_2S$, or COS or combinations thereof.

Prior to activating the plasma, an inert gas may be sequentially or simultaneously added to the sulfur-containing gas. The inert gas may be Ar, Kr, Xe, Ne, $N_2$, He or combination thereof.

The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Preferably silicon oxide is $Si_nO_m$, where n ranges from 0.5 to 1.5 and m ranges from 1.5 to 3.5. More preferably, silicon oxide is $SiO_2$. Herein, SiN and SiO in the following description are used to represent $Si_kN_l$ and $Si_nO_m$ containing layers, respectively. The silicon-containing film could also be a silicon oxide based dielectric material such as organic based or silicon oxide based low-k dielectric materials such as the Black Diamond II or III material by Applied Materials, Inc. with a formula of SiOCH. The one or more silicon-containing films may include $Si_aO_bC_cN_dH_e$ where a, b, c, d, e range from 0.1 to 6 and b, c, d, e each is independently 0. The one or more silicon-containing films may include dopants such as B, C, P, As, Ga, In, Sn, Sb, Bi or Ge.

The substrate contains silicon-containing materials, such as $SiO_2$, SiN, or Si. One example is alternating layers of SiO and SiN as used in 3D NAND applications. The silicon-containing film or material comprises a layer of $Si_aO_bH_cC_dN_e$, where a >0, b, c, d and e≥0, selected from silicon oxide, silicon nitride, crystalline Si, poly-silicon, polycrystalline silicon, amorphous silicon, low-k SiCOH, SiOCN, SiC, SiON, or a stack of alternating silicon oxide and silicon nitride (ONON) films or alternating silicon oxide and poly-silicon (OPOP) films. The substrate may be a silicon-containing material. The substrate may be $SiO_2$, SiN, Si or an alternating layers of SiO and SiN.

On top of the silicon-containing films or materials is the patterned mask layer or mask material. The mask material may be a layer of amorphous carbon, doped amorphous carbon, spin on carbon (SOC), Si, SiN, Al, AlO, Ti, TiO or other metal and metal oxide masks, or other nitrides such as TiN, with or without dopants.

The vapor of the disclosed sulfur-containing etching compounds is introduced into the reaction chamber containing the substrate and silicon-containing films. The vapor may be introduced to the chamber at a flow rate ranging from approximately 0.1 sccm to approximately 1000 sccm. Here sccm is standard cubic centimeters per minute. For example, for a 200 mm wafer size, the vapor may be introduced to the chamber at a flow rate ranging from approximately 5 sccm to approximately 50 sccm. Alternatively, for a 450 mm wafer size, the vapor may be introduced to the chamber at a flow rate ranging from approximately 25 sccm to approximately 250 sccm. One of ordinary skill in the art will recognize that the flow rate may vary from tool to tool.

The gas or vapor in the disclosed etching and deposition methods may be supplied either in a cylinder or in a bubbler with a dip tube. The molecule may be bubbled with an inert gas such as Ar, where the bubbler may be heated and lines may be heated to increase the vapor delivered to the chamber. The bubbler may be located close to the tool to reduce the likelihood of condensation in the line and the pressure drop across long delivery lines. The bubbler may also not have a dip tube and instead use just a vapor draw and sweep gas configuration with an inert gas such as Ar. Other common methods of delivery of low vapor pressure molecules including methods such as vaporizers could be used.

As sulfur is a known catalyst for etching processes based on $SF_6$ plasma processes, the disclosed new aromatic sulfur-containing etchants may enhance the etching rate of silicon molecules but with a low GWP as compared to $SF_6$. The disclosed plasma etch method uses the disclosed new aromatic sulfur-containing etchants as etching gas to produce apertures, such as channel holes, gate trenches, staircase contacts, capacitor holes, contact holes, contact etch, slit etch, self-aligned contact, self-aligned vias, super vias etc., in silicon-containing films. The resulting apertures or structures may have an aspect ratio ranging from approximately 5:1 to approximately 500:1, preferably from approximately 20:1 to approximately 400:1. The resulting apertures may have a diameter ranging from approximately 0.1 nm to approximately 500 nm; preferably, ranging from approximately 0.1 nm to approximately 500 nm; more preferably being less than 100 nm. The resulting apertures may have an aspect ratio above 1:1, preferably above 5:1, more preferably above 10:1, even more preferably above 20:1. The resulting apertures may have an aspect ratio ranging from 1:1 to 5:1. For example, one of ordinary skill in the art will recognize that a channel hole etch produces apertures in the silicon-containing films having an aspect ratio greater than 50:1.

EXAMPLES

The following non-limiting examples are provided to further illustrate embodiments of the invention. However, the examples are not intended to be all inclusive and are not intended to limit the scope of the inventions described herein.

Prophetic Example 1: Silicon-Containing Film Etching

In a 300 mm CCP plasma etch chamber a fluorinated aromatic sulfur-containing molecule, such as $C_6H_2F_4S$, CAS #769-40-4, a gas selected from Table 2, an inert gas such as argon, and an oxidizing gas such as $O_2$ were flowed into the chamber. A silicon-containing wafer with a silicon-containing thin film disposed on the surface was inserted into the chamber. The plasma source and bias powers were turned on. The thin film was etched. The wafer was then removed from the plasma etch chamber.

Prophetic Example 2: 3D NAND Etching

In a 300 mm CCP plasma etch chamber a fluorinated aromatic sulfur-containing molecule, such as $C_6H_2F_4S$, CAS #769-40-4, a gas selected from Table 2, a fluorocarbon or hydrofluorocarbon gas, an inert gas and an oxidizing gas were flowed into the chamber. A silicon-containing wafer with alternating layers of $SiO_2$ and SiN with a patterned a-C mask layer on top was inserted into the chamber. The plasma for the source and bias power was turned on. The $SiO_2$ and SiN layers were selectively etched from the a-C mask layer resulting in a nearly vertical anisotropically etched hole to the substrate.

Prophetic Example 3: Cryogenic Plasma Etching

In a 300 mm CCP plasma etch chamber a fluorinated aromatic sulfur-containing molecules, such as $C_6H_2F_4S$, CAS #769-40-4, a gas selected from Table 2, a fluorocarbon or hydrofluorocarbon gas, and a fluoride gas such as HF were flowed into the chamber. A silicon-containing wafer with alternating layers of $SiO_2$ and SiN with a patterned a-C mask layer on top was inserted into the chamber. The wafer temperature was cooled to a temperature<$-20°$ C. The plasma for the source and bias power was turned on. The $SiO_2$ and SiN layers were selectively etched from the a-C mask layer resulting in a nearly vertical anisotropically etched hole to the substrate. The substrate temperature was increased to >$-20°$ C. to volatilize any etching residues.

Prophetic Example 4: Atomic Layer Etching

In a 300 mm CCP plasma etch chamber a silicon-containing wafer with a silicon containing layer such as SiN with a patterned a-C mask layer on top was inserted into the chamber. A fluorinated aromatic sulfur-containing molecules, such as, $C_6H_4F_2S$, CAS #60811-24-7, a gas selected from Table 2, was flowed into the chamber. The plasma for the source power was turned on and a polymer layer was deposited. The flow of the fluorinated aromatic sulfur-containing molecule was stopped and the chamber was vacuumed and an inert gas such as argon was flowed in the chamber to purge out the remaining fluorinated aromatic sulfur-containing molecule. Next, argon was flowed in the chamber and the plasma for the source and bias power was turned on etching the silicon-containing layer selectively from the a-C mask layer resulting in a nearly vertical anisotropically etched hole to the substrate. The chamber was then vacuumed and purged with an inert gas such as argon. The cycle was then repeated a number of times to etch to the target depth with very high etching selectivity and vertical profile. It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. An etching method for forming a structure by selectively etching one or more silicon-containing films in a substrate using a patterned mask layer deposited on top of the one or more silicon-containing films, the method comprising:
    mounting the substrate in a reaction chamber;
    introducing an etching gas containing a sulfur-containing gas into the reaction chamber;
    converting the etching gas to a plasma; and
    allowing an etching reaction to proceed between the plasma and the one or more silicon-containing films so that the one or more silicon-containing films are selectively etched versus the patterned mask layer to form the structure,
    wherein the sulfur-containing gas contains a —SH thiol group and an aromatic 6 membered carbon ring having the formula

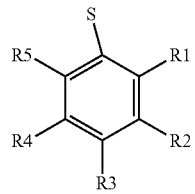

wherein R1, R2, R3, R4 and R5 are independently selected from F, H, and/or $C_xF_yH_z$ group substituted on the aromatic ring, where x, y and z are integers, at least one of the R1, R2, R3, R4 and R5 contains at least one fluorine atom, and S represents the —SH thiol group.

2. The method of claim 1, wherein the $C_xF_yH_z$ group is selected from $CF_3$, $CH_2F$, or $CHF_2$.

3. The method of claim 1, further comprising
    adding one or more hydrofluorocarbon, fluorocarbon, sulfur fluoride or nitrogen fluoride etching gases to the sulfur-containing gas, wherein the one or more fluorocarbon etching gases are selected from $C_4F_6$, $C_4F_8$, $C_4H_2F_6$, $CHF_3$, $CH_2F_2$, $CH_3F$, $CF_4$, $C_2F_6$, $C_3F_8$, $SF_6$, $NF_3$, $C_2F_4$, $C_3F_6$, $C_4F_{10}$, $C_5F_8$, $C_6F_6$, $C_2H_5F$, $C_3H_7F$, $C_3H_2F_6$, $C_2HF_5$, $C_2H_2F_2$, $C_xF_yH_z$ molecule (x, y, and z are integers) or combination thereof.

4. The method of claim 1, further comprising
    adding an additive to the sulfur-containing gas, wherein the additive is selected from $H_2$, $SF_6$, $NF_3$, $N_2$, $NH_3$, $Cl_2$, $BCl_3$, $BF_3$, $PF_3$, $PCl_3$, $PBr_3$, $PH_3$, $POCl_3$, $PF_5$, $POF_3$, $PH_3$ or $P(R)_3$ where R is an alkyl, or fluorinated alkyl groups selected from $CF_3$, $Br_2$, $F_2$, HF, HBr, HCl, HI, $IF_5$, or $IF_7$.

5. The method of claim 1, further comprising
    prior to activating the plasma, sequentially or simultaneously exposing the substrate to a co-reactant.

6. The method of claim 5, wherein the co-reactant is selected from $O_2$, CO, $CO_2$, NO, $NO_2$, $N_2O$, $SO_2$, $H_2S$, or COS or combinations thereof.

7. The method of claim 5, wherein the co-reactant is selected from $H_2$, $SF_6$, $NF_3$, $N_2$, $NH_3$, $Cl_2$, $BCl_3$, $BF_3$, $PF_3$, $PCl_3$, $PBr_3$, $PH_3$, $POCl_3$, $PF_5$, $POF_3$, $PH_3$ or $P(R)_3$ where R is an alkyl, or fluorinated alkyl groups selected from $CF_3$, $Br_2$, $F_2$, HF, HBr, HCl, HI, $IF_5$, or $IF_7$.

8. The method of claim 1, further comprising
    prior to activating the plasma, sequentially or simultaneously exposing the substrate to an inert gas selected from Ar, Kr, Xe, Ne, $N_2$, He or combination thereof.

9. The method of claim 1, wherein a temperature of the substrate ranges from approximately −196° C. to approximately 300° C.

10. The method of claim 1, wherein a temperature of the substrate ranges from approximately −196° C. to approximately 60° C.

11. The method of claim 1, further comprising
    cooling the substrate to a temperature below approximately 25° C.

12. The method of claim 11, wherein the temperature of the substrate is below approximately −20° C.

13. The method of claim 11, wherein the temperature of the substrate ranges from approximately −196° C. to approximately −20° C.

14. The method of claim 11, wherein after the structure is formed, the temperature of the substrate is increased to greater than −20° C.

15. The method of claim 1, wherein the sulfur-containing gas is selected from the group consisting of $C_6HF_5S$, $C_6H_4F_2S$, $C_7HF_7S$, $C_7H_5F_3S$, $C_6H_4F_2S$, $C_6H_3F_3S$, $C_6H_3F_3S$, $C_6H_3F_3S$, $C_7H_4F_4S$, $C_7H_3F_5S$, $C_6H_3F_7S$, $C_7H_3F_5S$, $C_7H_3F_5S$, and $C_7H_4F_4S$.

16. The method of claim 1, wherein a mask material of the patterned mask layer is amorphous carbon, doped amorphous carbon, Si, SiN, Al, AlO, Ti, TiO or a metal and metal oxide.

17. The method of claim 1, wherein the one or more silicon-containing films include $Si_aO_bC_cN_dH_e$ where a, b, c, d, e range from 0.1 to 6 and b, c, d, e each is independently 0.

18. The method of claim 1, wherein the substrate is silicon-containing material.

19. The method of claim 1, wherein the substrate is $SiO_2$, SiN, Si or an alternating layers of SiO and SiN.

20. The method of claim 1, wherein the aspect ratio of the structure ranges from approximately 5:1 to approximately 500:1.

* * * * *